US012235692B2

(12) United States Patent
Huang et al.

(10) Patent No.: US 12,235,692 B2
(45) Date of Patent: Feb. 25, 2025

(54) RISER CARD MODULE AND EXPANSION CARD DEVICE

(71) Applicants: INVENTEC (PUDONG) TECHNOLOGY CORPORATION, Shanghai (CN); INVENTEC CORPORATION, Taipei (TW)

(72) Inventors: Wen-Long Huang, Shanghai (CN); Xishan Shen, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 231 days.

(21) Appl. No.: 18/125,088

(22) Filed: Mar. 22, 2023

(65) Prior Publication Data

US 2024/0314961 A1  Sep. 19, 2024

(30) Foreign Application Priority Data

Mar. 14, 2023 (CN) .......................... 202310246265.9

(51) Int. Cl.
*G06F 1/18* (2006.01)
(52) U.S. Cl.
CPC .................................... *G06F 1/185* (2013.01)

(58) Field of Classification Search
CPC .............................. G06F 1/185; H05K 7/1461
See application file for complete search history.

(56) References Cited

U.S. PATENT DOCUMENTS 4,979,075 A  * 12/1990  Murphy ................. G06F 1/184
                                              361/810
6,618,260 B2 *  9/2003  Willis ..................... G06F 1/184
                                             361/679.48

* cited by examiner

*Primary Examiner* — James Wu
(74) *Attorney, Agent, or Firm* — Maschoff Brennan

(57) ABSTRACT

A riser card module includes a frame assembly, two first riser card assemblies and two second riser card assemblies. The frame assembly includes a mount component, a first frame and a second frame. The first frame and the second frame are fixed to the mount component, the first frame has two first installation slots, and the second frame has two second installation slots. The first riser card assemblies each includes a first circuit board and a first cable connected to each other. The two first circuit boards are respectively mounted into the two first installation slots. The second riser card assemblies each includes a second circuit board and a second cable connected to each other. The two second circuit boards are respectively mounted into the two second installation slots, and colors of the two second cables are different from colors of the two first cables.

10 Claims, 8 Drawing Sheets

RISER CARD MODULE AND EXPANSION CARD DEVICE

CROSS-REFERENCE TO RELATED APPLICATIONS

This non-provisional application claims priority under 35 U.S.C. § 119(a) on Patent Application No(s). 202310246265.9 filed in China, on Mar. 14, 2023, the entire contents of which are hereby incorporated by reference.

BACKGROUND OF THE INVENTION

Technical Field of the Invention

The invention relates to a riser card module and an expansion card device.

Description of the Related Art

A conventional 1U server equips two PCIe expansion cards. In order to improve the performance of the server, server manufacturers are trying to arrange four expansion cards in an interior space of the 1U server. In general, the four expansion cards each is required to be cooperated with one riser card, and one riser is required to be electrically connected to a motherboard via one cable. Therefore, the quantity of electrical connectors of the motherboard is required to be increased for the cables to be installed thereon.

In the configuration of the present server, the cables are unable to be arbitrarily installed on the electrical connectors of the motherboard; that is, each cable is required to be installed on specific electrical connectors of the motherboard. However, there are many electrical connectors on the motherboard, it is easy to install the cable on incorrect electrical connectors, causing abnormal operation of the server. Therefore, how to solve the aforementioned issue is one of the crucial topics in this field.

SUMMARY OF THE INVENTION

The invention provides a riser card module and an expansion card device which are capable of reducing the possibility of the installation of the cables on the incorrect electrical connectors of the motherboard.

One embodiment of the invention provides a riser card module. The riser card module includes a frame assembly, two first riser card assemblies and two second riser card assemblies. The frame assembly includes a mount component, a first frame and a second frame. The first frame and the second frame are fixed to the mount component, the first frame has two first installation slots, and the second frame has two second installation slots. The first riser card assemblies each includes a first circuit board and a first cable connected to each other. The two first circuit boards are respectively mounted into the two first installation slots. The second riser card assemblies each includes a second circuit board and a second cable connected to each other. The two second circuit boards are respectively mounted into the two second installation slots, and colors of the two second cables are different from colors of the two first cables.

Another embodiment of the invention includes an expansion card device. The expansion card device includes a casing, a riser card module and four expansion cards. The riser card module includes a frame assembly, two first riser card assemblies and two second riser card assemblies. The frame assembly is fixed to the casing and includes a mount component, a first frame and a second frame. The first frame and the second frame are fixed to the mount component, the first frame has two first installation slots, and the second frame has two second installation slots. The first riser card assemblies each includes a first circuit board and a first cable connected to each other. The two first circuit boards are respectively mounted into the two first installation slots. The second riser card assemblies each includes a second circuit board and a second cable connected to each other. The two second circuit boards are respectively mounted into the two second installation slots, and colors of the two second cables are different from colors of the two first cables. The four expansion cards are respectively mounted to the two first circuit boards and the two second circuit boards.

According to the riser card module and the expansion card device as disclosed in the above embodiments, the colors of the second cables of the second riser card assemblies are different from the colors of the first cables of the first riser card assemblies, such that electrical connectors of a motherboard corresponding to each cable can be determined according to the colors of the cables, and thus the possibility of the installation of the first cables and the second cables on the incorrect electrical connectors of the motherboard can be reduced.

BRIEF DESCRIPTION OF THE DRAWINGS

The invention will become more fully understood from the detailed description given hereinbelow and the accompanying drawings which are given by way of illustration only and thus are not limitative of the present invention and wherein.

DETAILED DESCRIPTION

Figure 1:
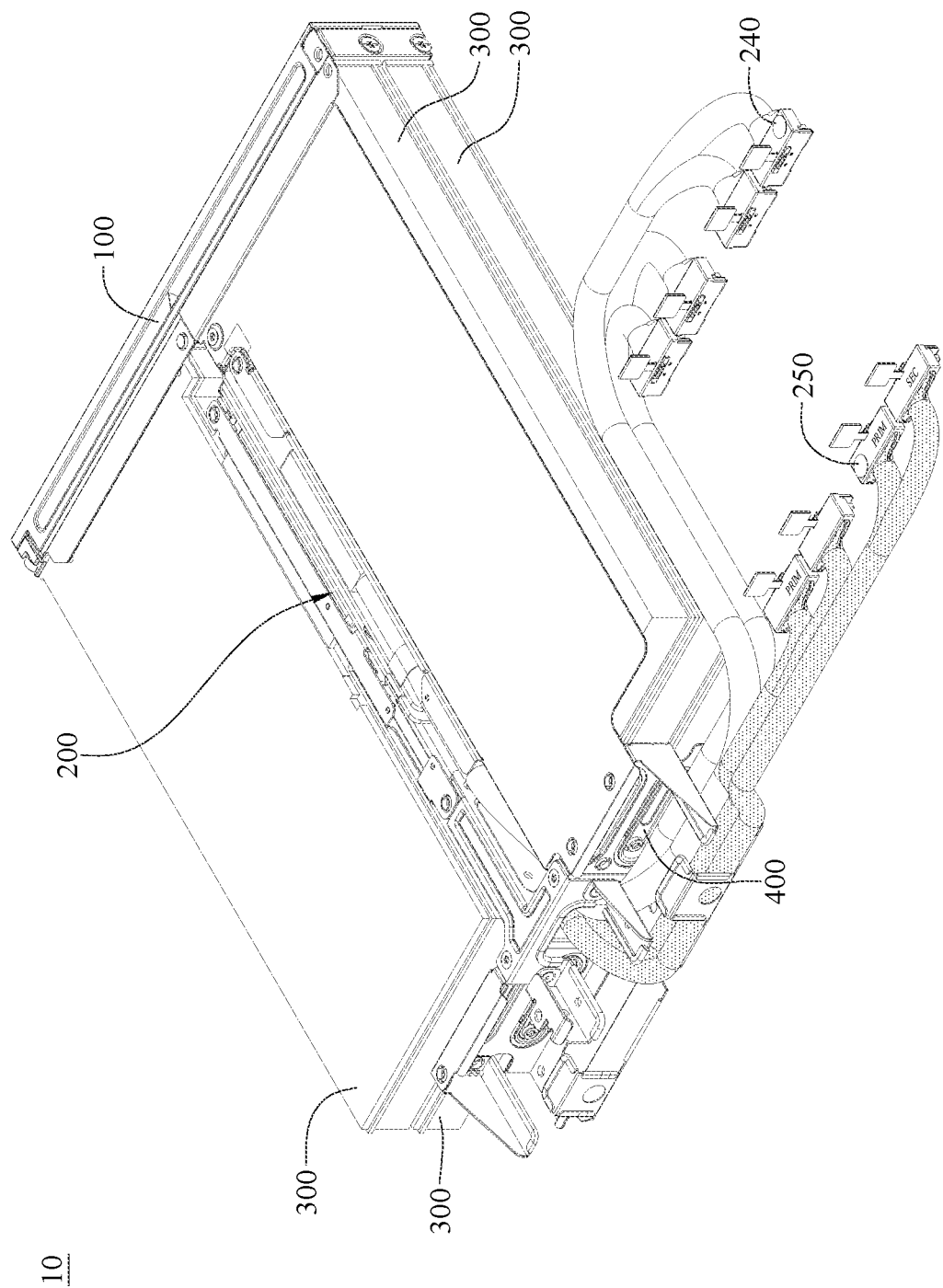
FIG. 1 is a perspective view of an expansion card device according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present invention, such as technical and scientific terms, have its own meanings and can be comprehended by those skilled in the art, unless the terms are additionally defined in the present invention. That is, the terms used in the following paragraphs should be read on the meaning commonly used in the related fields and will not be overly explained, unless the terms have a specific meaning in the present invention.

Figure 2:
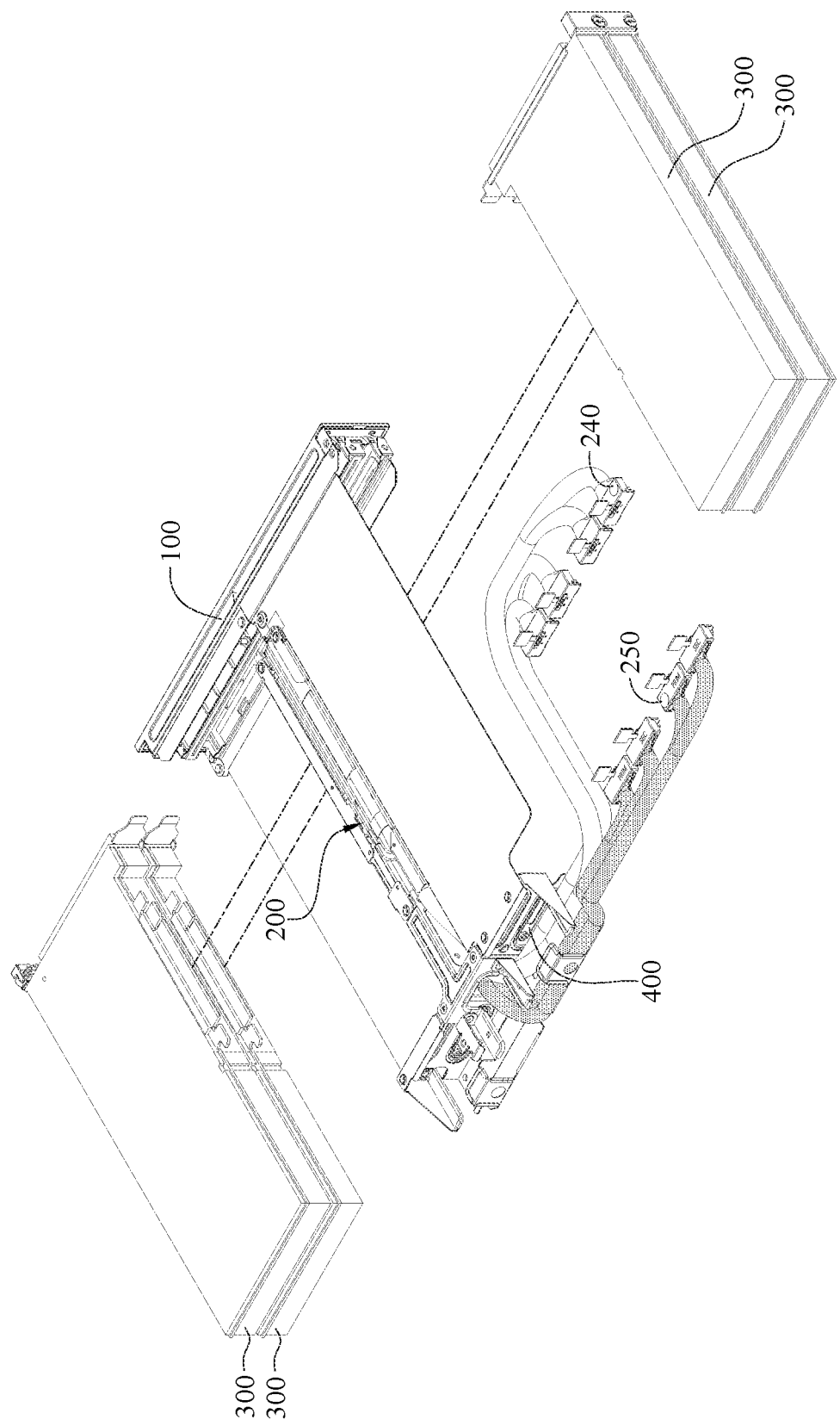
FIG. 2 is an exploded view of the expansion card device in FIG. 1.
Figure 3:
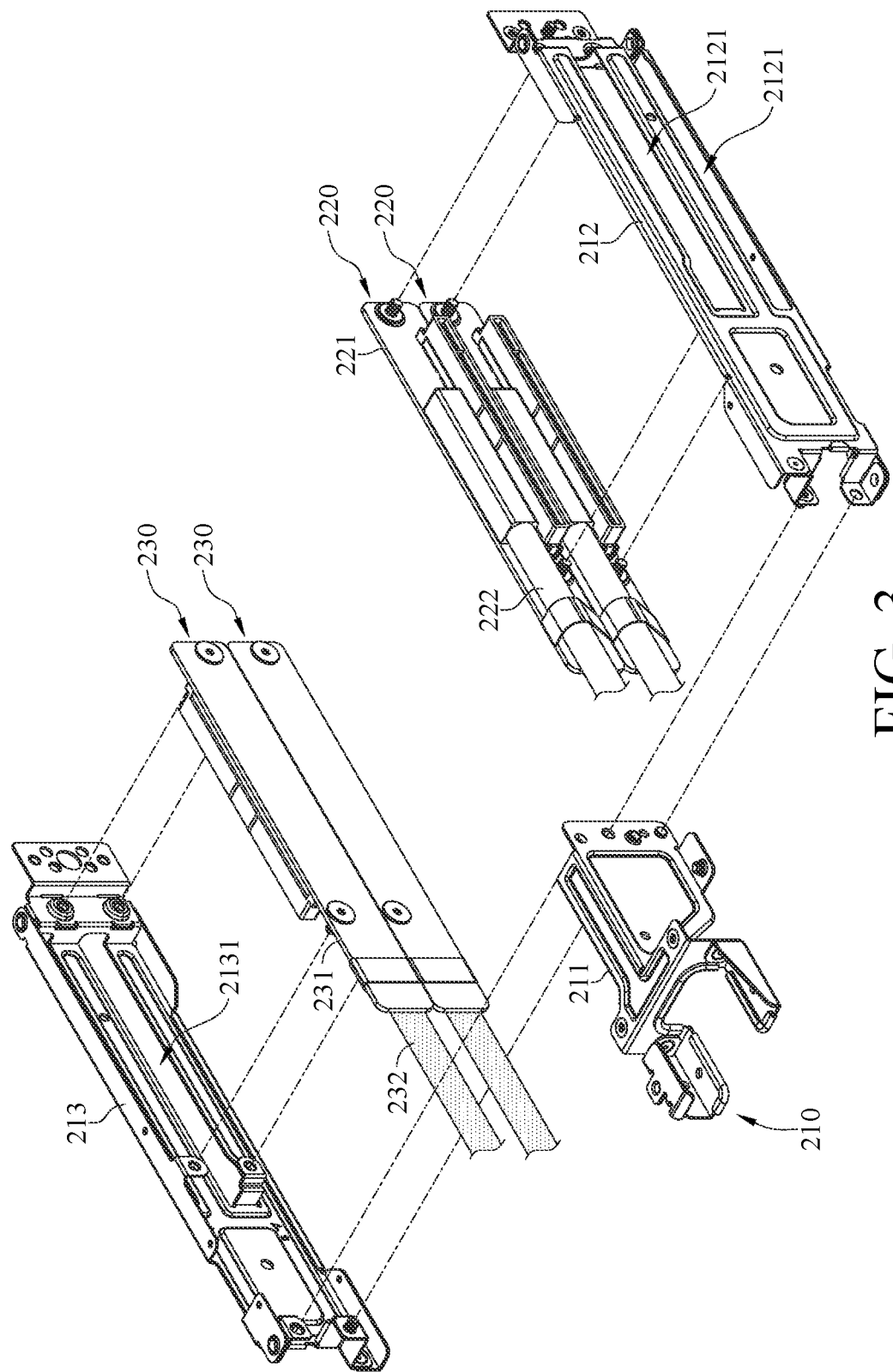
FIG. 3 is a partial exploded view of a riser card module of the expansion card device in FIG. 2.

Referring to FIGS. 1 to 3, FIG. 1 is a perspective view of an expansion card device 10 according to one embodiment of the disclosure, FIG. 2 is an exploded view of the expansion card device 10 in FIG. 1, and FIG. 3 is a partial exploded view of a riser card module 200 of the expansion card device 10 in FIG. 2.

In this embodiment, the expansion card device 10 is, for example, adapted for a server 1 (e.g., shown in FIG. 8), and the server 1 is, for example, a 1U server. The expansion card device 10 includes a casing 100, a riser card module 200 and four expansion cards 300.

The riser card module 200 includes a frame assembly 210, two first riser card assemblies 220 and two second riser card assemblies 230. In addition, the riser card module 200 may further include a first label 240 and a second label 250.

Figure 4:
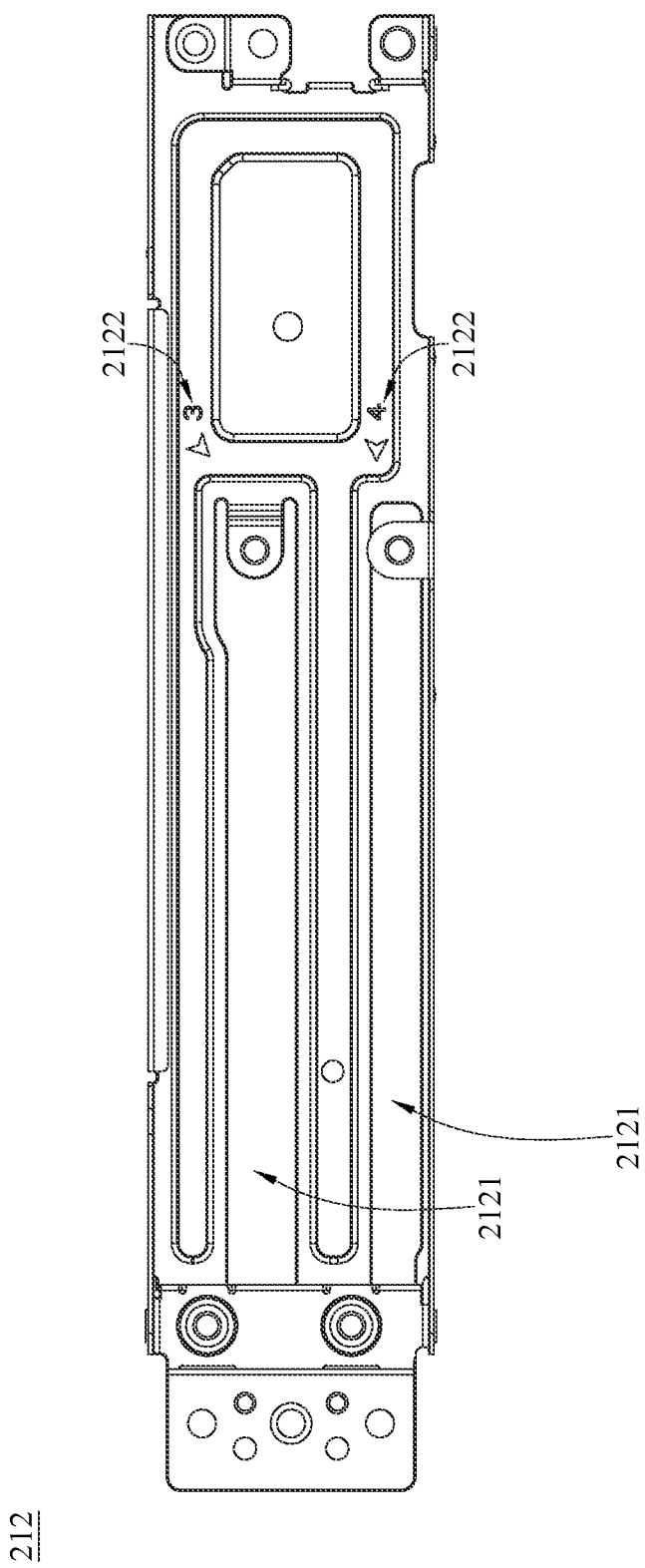
FIG. 4 is a schematic view of a first frame of the riser card module in FIG. 3.
Figure 5:
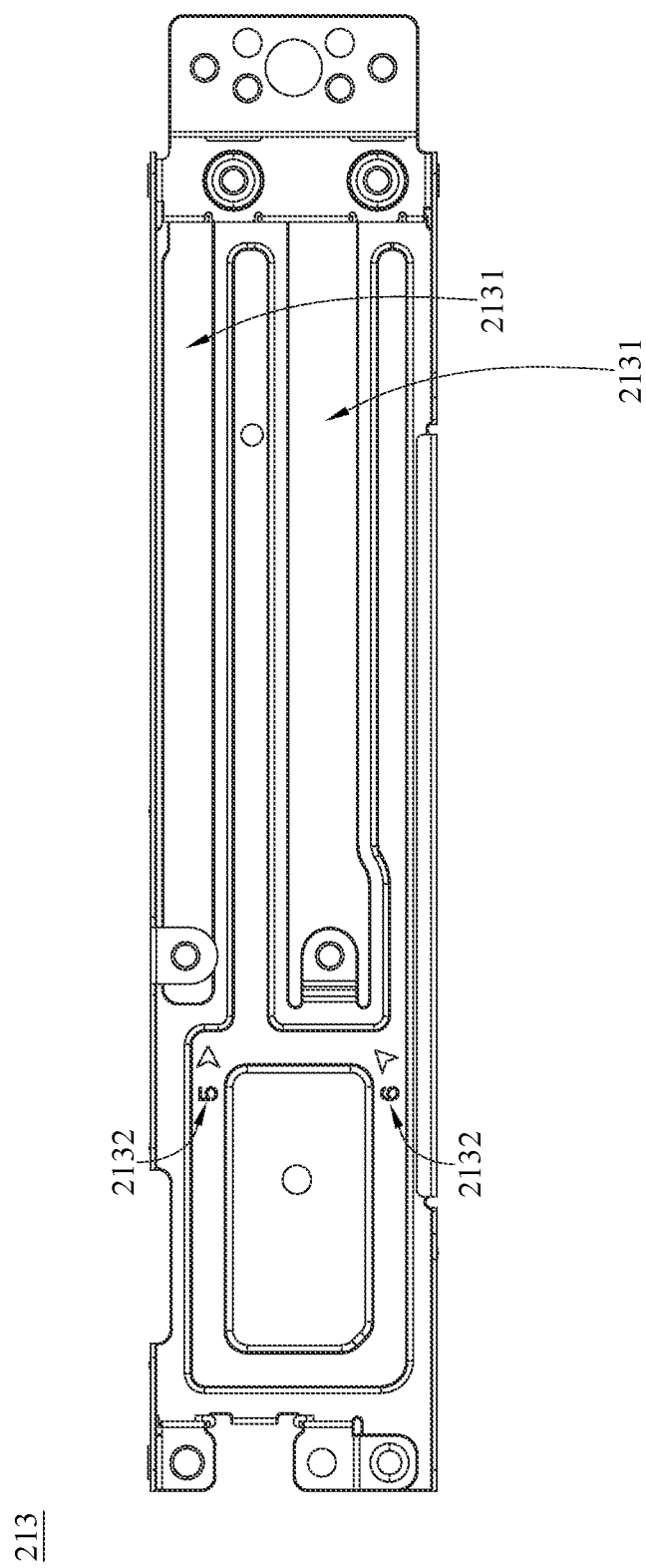
FIG. 5 is a schematic view of a second frame of the riser card module in FIG. 3.

Then, referring to FIGS. 3 to 5, FIG. 4 is a schematic view of a first frame 212 of the riser card module 200 in FIG. 3, and FIG. 5 is a schematic view of a second frame 213 of the riser card module 200 in FIG. 3.

The frame assembly 210 is fixed to the casing 100 and includes a mount component 211, a first frame 212 and a second frame 213. The first frame 212 and the second frame 213 are fixed to the mount component 211. The first frame 212 has two first installation slots 2121 and two marks 2122. The marks 2122 are different from each other and are respectively located aside the two first installation slots 2121. The second frame 213 has two second installation slots 2131 and two marks 2132. The marks 2132 are different from each other and are respectively located aside the two second installation slots 2131. The marks 2122 of the first frame 212 are, for example, numbers as "3" and "4", and the marks 2132 of the second frame 213 are, for example, numbers as "5" and "6", but the invention is not limited thereto; in some other embodiments, the marks of the first frame may be patterns, symbols or letters different from each other, and the marks of the second frame may be patterns, symbols or letters different from each other.

Figure 6:
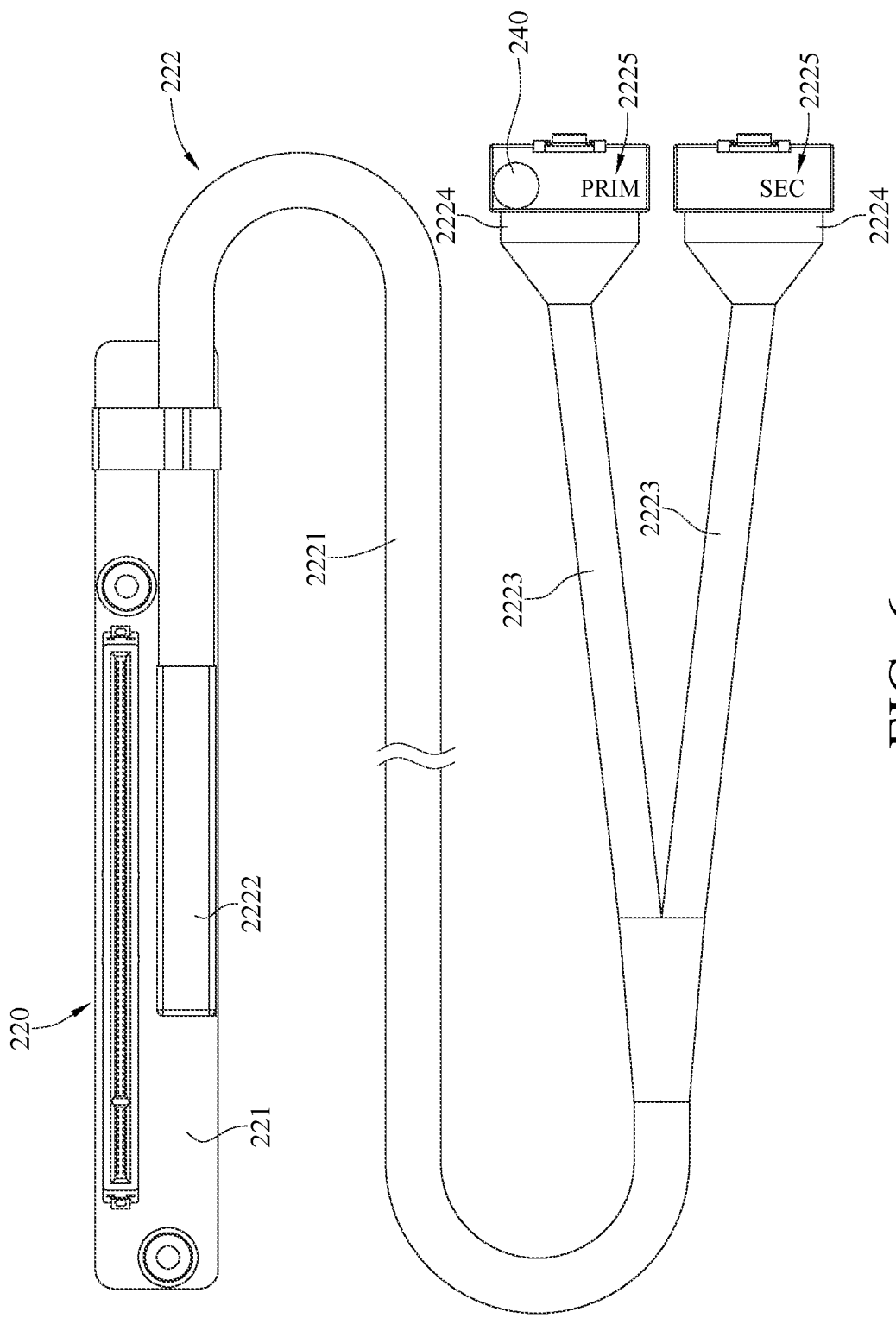
FIG. 6 is a schematic view of a first riser card assembly of the riser card module in FIG. 3.

The two first riser card assemblies 220 are substantially the same in structure, and thus the following paragraph introduces one of them. Referring to FIGS. 3 and 6 together, where FIG. 6 is a schematic view of the first riser card assembly 220 of the riser card module 200 in FIG. 3.

The first riser card assembly 220 includes a first circuit board 221 and a first cable 222. The first cable 222 includes a first main route 2221, a first main electrical connector 2222, two first branch routes 2223 and two first sub electrical connectors 2224. The first main electrical connector 2222 is connected to one end of the first main route 2221 and is mounted on the first circuit board 221. The two first branch routes 2223 are connected to another end of the first main route 2221. The two first sub electrical connectors 2224 are respectively connected to ends of the two first branch routes 2223 located farther away from the first main route 2221. Marks 2225 of the two first sub electrical connectors 2224 are different from each other. For example, the mark 2225 of one of the first sub electrical connectors 2224 is a word as "PRIM", which represents that this first sub electrical connector 2224 is a primary sub electrical connector. On the other hand, the mark 2225 of the other one of the first sub electrical connectors 2224 is a word as "SEC", which represents that this first sub electrical connector 2224 is a secondary sub electrical connector.

In this embodiment, the two first circuit boards 221 of the two first riser card assemblies 220 are respectively mounted in the first installation slots 2121 of the first frame 212. In addition, colors of the two first cables of the two first riser card assemblies 220 are the same as each other, such as while color. As shown in FIG. 6, the first label 240 is adhered on the first sub electrically connector 2224 of one of the first cables 222 which has the mark 2225 as "PRIM", but the invention is not limited thereto; in some other embodiments, the first label may be adhered on the first sub electrically connector of one of the first cables which has the mark as "SEC".

Figure 7:
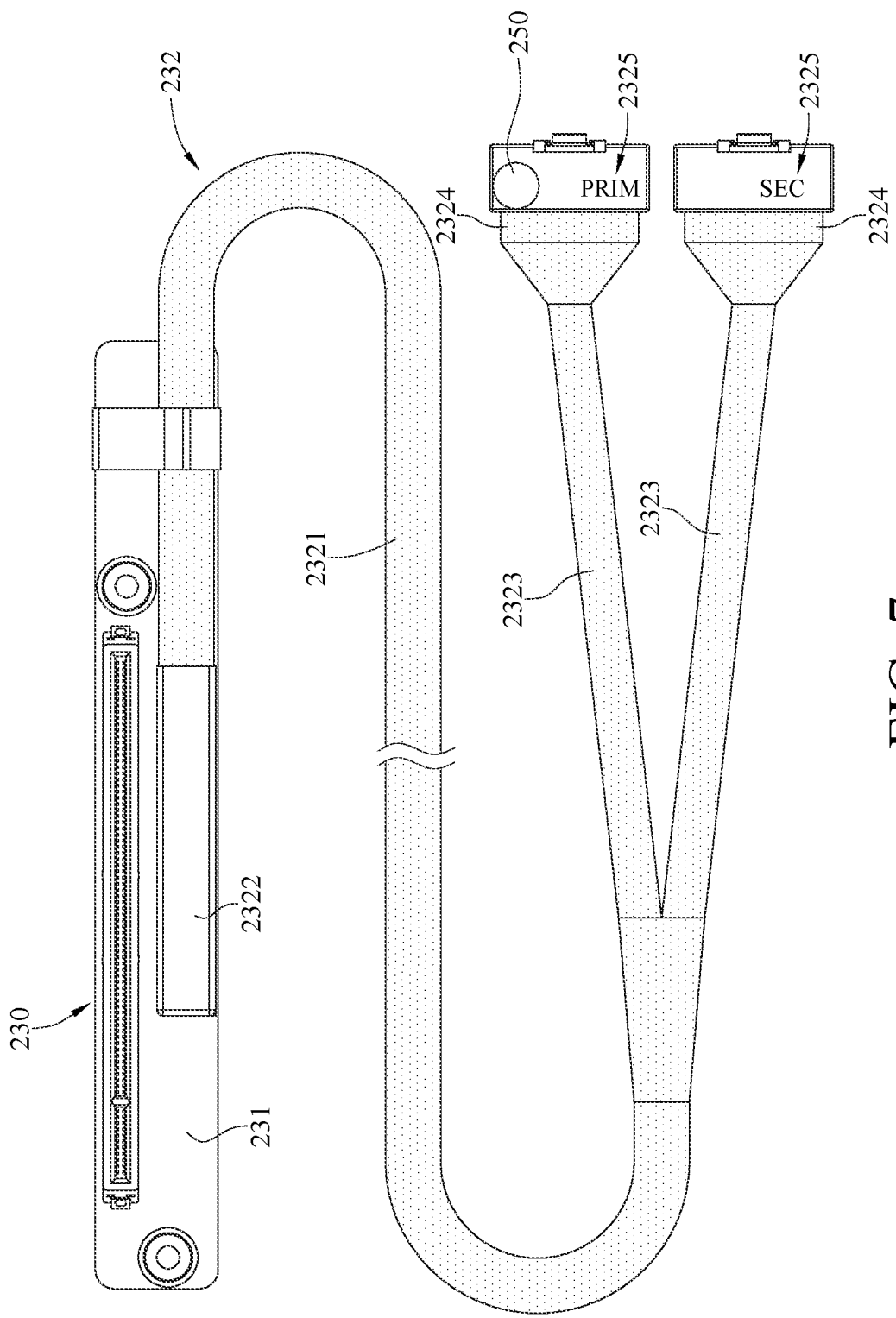
FIG. 7 is a schematic view of a second riser card assembly of the riser card module in FIG. 3.

The two second riser card assemblies 230 are substantially the same in structure, and thus the following paragraph introduces one of them. Referring to FIGS. 3 and 7 together, where FIG. 7 is a schematic view of the second riser card assembly 230 of the riser card module 200 in FIG. 3.

The second riser card assembly 230 includes a second circuit board 231 and a second cable 232. The second cable 232 includes a second main route 2321, a second main electrical connector 2322, two second branch routes 2323 and two second sub electrical connectors 2324. The second main electrical connector 2322 is connected to one end of the second main route 2321 and is mounted on the second circuit board 231. The two second branch routes 2323 are connected to another end of the second main route 2321. The two second sub electrical connectors 2324 are respectively connected to ends of the second branch routes 2323 located farther away from the second main route 2321. Marks 2325 of the two second sub electrical connectors 2324 are different from each other. For example, the mark 2325 of one of the second sub electrical connectors 2324 is a word as "PRIM", which represents that this second sub electrical connector 2324 is a primary sub electrical connector. On the other hand, the mark of the other one of the second sub electrical connectors 2324 is a word as "SEC", which represents that this second sub electrical connector 2324 is a secondary sub electrical connector.

In this embodiment, the two second circuit boards 231 of the two second riser card assemblies 230 are respectively mounted in the second installation slots 2131 of the second frame 213. In addition, colors of the two second cables 232 of the two second riser card assemblies 230 are the same as each other, such as blue color. As shown in FIG. 7, the second label 250 is adhered on the second sub electrically connector 2324 of one of the second cables 232 which has the mark 2325 as "PRIM", but the invention is not limited thereto; in some other embodiments, the second label may be adhered on the second sub electrically connector of one of the second cables which has the mark as "SEC".

The four expansion cards 300 are respectively mounted on the two first circuit boards 221 and the two second circuit boards 231, and the four expansion cards 300 can be electrically connected to a motherboard 2 of the server 1 via the two first riser card assemblies 220 and the two second riser card assemblies 230, respectively.

Figure 8:
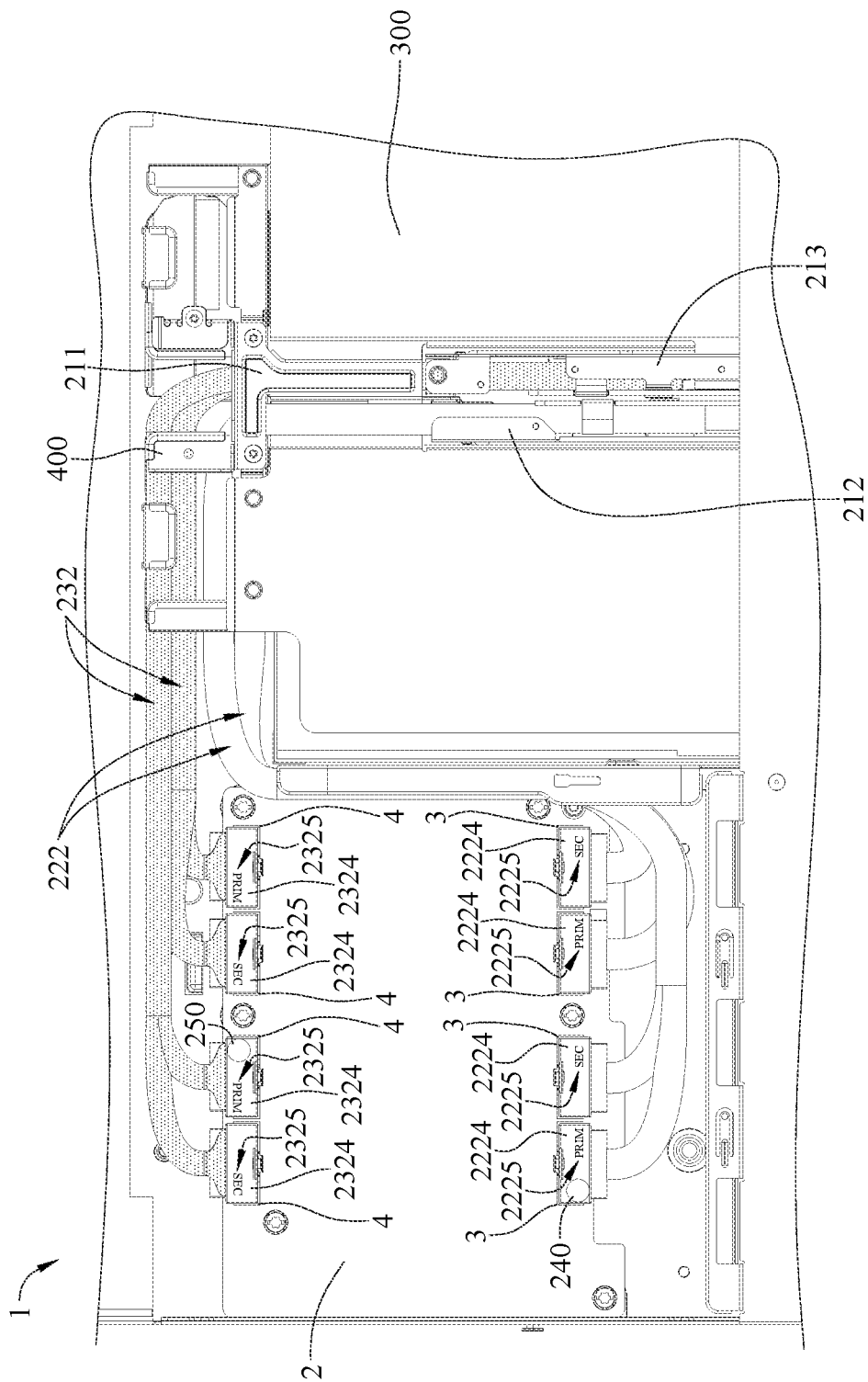
FIG. 8 is a partial schematic view of the expansion card device in FIG. 1 when the expansion card device is installed in a server casing.

Specifically, referring to FIG. 8, FIG. 8 is a partial schematic view of the expansion card device 10 in FIG. 1 when the expansion card device 10 is installed in a server casing.

The motherboard 2 of the server has four first electrical connectors 3 and four second electrical connectors 4. The first electrical connectors 3 are arranged side by side, and the four second electrical connectors 4 are arranged side by side and are located closer to a rear side of the server 1 than the four first electrical connectors 3. Two of the first electrical connectors 3 are one pair of the first electrical connectors 3, this pair of the first electrical connectors 3 can only be cooperated with one of the first cables 222 on which the first label 240 is adhered, and this pair of the first electrical connector 3 have marks as "PRIM" and "SEC" (not shown), respectively. The other two of the first electrical connectors 3 are another pair of the first electrical connectors 3, this pair of the first electrical connectors 3 can only be cooperated with the other one of the first cable 222 without the first label 240 adhered thereon, and this pair of the first electrical connectors 3 have marks as "PRIM" and "SEC", respectively. Two of the second electrical connectors 4 are one pair of the second electrical connectors 4, this pair of the second electrical connectors 4 can only be cooperated with one of the second cables 232 on which the second label 250 is adhered, and this pair of the second electrical connectors 4 have marks as "PRIM" and "SEC", respectively. The other two of the second electrical connectors 4 are another pair of the second electrical connectors 4, this pair of the second electrical connectors 4 can only be cooperated with the other one of the second cable 232 without the second label 250 adhered thereon, and this pair of the second electrical connectors 4 have marks as "PRIM" and "SEC", respectively.

After the expansion card device 10 is installed on the server 1, the electrical connectors of the motherboard 2 corresponding to each cable can be determined according to the colors of the cables; that is, the white first cables 222 correspond to the first electrical connectors 3 of the motherboard 2, and the blue second cables 232 correspond to the second electrical connectors 4 of the motherboard 2. Then, according to whether there is a label adhered on a cable or not, each of the first cables 222 can be determined to correspond to one pair of the first electrical connectors 3, and each of the second cables 232 can be determined to correspond one pair of the second electrical connectors 4. Then, the first sub electrical connectors 2224 of the first cables 222 having the marks 2225 as "PRIM" are respectively installed on the first electrical connectors 3 of the motherboard 2 having the marks as "PRIM", the first sub electrical connectors 2224 of the first cables 222 having the mark 2225 as "SEC" are respectively installed on the first electrical connectors 3 of the motherboard 2 having the mark as "SEC", the second sub electrical connectors 2324 of the second cables 232 having the marks 2325 as "PRIM" are respectively installed on the second electrical connectors 4 of the motherboard 2 having the marks as "PRIM", and the second sub electrical connectors 2324 of the second cables 232 having the mark 2325 as "SEC" are respectively installed on the second electrical connectors 4 of the motherboard 2 having the mark as "SEC". As a result, the four expansion cards 300 are electrically connected to the motherboard 2.

In this embodiment, the colors of the second cables 232 of the second riser card assemblies 230 are different from the colors of the first cables 222 of the first riser card assemblies 220, such that the electrical connectors of the motherboard 2 corresponding to each cable can be determined according to the colors of the cables, and thus the possibility of the installation of the first cables 222 and the second cables 232 on the incorrect electrical connectors of the motherboard 2 can be reduced.

In addition, the first label 240 is merely adhered on one of the first sub electrical connectors 2224 of one of the white first cables 222, and the second label 250 is merely adhered on one of the second sub electrical connectors 2324 of one of the blue first cables 232, such that one pair of the electrical connectors of the motherboard 2 corresponding to two sub electrical connectors of each cable can be determined, and thus the possibility of the installation of the first cables 222 and the second cables 232 on the incorrect electrical connectors of the motherboard 2 can be further reduced.

Note that each of the first cables 222 and the second cables 232 are not restricted to including two branch routes and two sub electrical connectors. In some other embodiments, each of the first cables and the second cables may not include any branch route and sub electrical connector, but further include another main electrical connector connected to another end of the main route. In such a case, the first label may be adhered on the first main electrical connector of one of the first cables, and the second label may be adhered on the second main electrical connector of one of the second cables.

Note that the first cables 222 are not restricted to having the same color, and the second cables 232 are not restricted to having the same color. In some other embodiments, the first cables may not have the same color, and the second cables may not have the same color. In such a case, one pair of the first electrical connectors of the motherboard corresponding to the first sub electrical connectors of each first cable can be determined according to the different colors of the first cables, and one pair of the second electrical connectors of the motherboard corresponding to the second sub electrical connectors of each second cable can be determined according to the different colors of the second cables. As a result, the first label and the second label may be omitted.

In this embodiment, the first sub electrical connectors 2224 of each of the first cables 222 have different marks 2225 as "PRIM" and "SEC", and the second sub electrical connectors 2324 of each of the second cables 232 have different marks 2325 as "PRIM" and "SEC", such that it helps to install the sub electrical connectors of each cable on the correct electrical connectors of the motherboard 2.

Note that the first sub electrical connectors 2224 of each first cable 222 are not restricted to having different marks 2225, and the second sub electrical connectors 2324 of each second cable 232 are not restricted to having different marks 2325. In a case that the first sub electrical connectors of each first cable are not distinguished into the primary and secondary sub electrical connectors, and the second sub electrical connectors of each second cable are not distinguished into the primary and secondary sub electrical connectors, the first sub electrical connectors of each first cable may not have any mark, and the second sub electrical connectors of each second cable may not have any mark.

In this embodiment, the marks 2122 of the first frame 212 located aside the first installation slots 2121 are different from each other, and the marks 2132 of the second frame 213 located aside the second installation slots 2131 are different from each other, such that it helps to install the two first circuit boards 221 to the correct first installation slots 2121 and install the two second circuit boards 231 to the correct second installation slots 2131. Note that the marks 2122 of the first frame 212 and the marks 2132 of the second frame 213 are optional structures and may be omitted in some other embodiments.

In this embodiment, the expansion card device 10 may further include a cable organizer 400. The cable organizer 400 may be fixed to the casing 100, and the cable organizer 400 can organize the two first cables 222 and two second cables 232 for gathering the first cables 222 and the second cables 232, such that an airflow for cooling the expansion cards 300 may be prevented from interfering by the first cables 222 and the second cables 232. Note that the cable organizer 400 is an optional component. In a case that the first cables and the second cables do not interfere the airflow, the cable organizer may be omitted.

According to the riser card module and the expansion card device as disclosed in the above embodiments, the colors of the second cables of the second riser card assemblies are different from the colors of the first cables of the first riser card assemblies, such that the electrical connectors of the motherboard corresponding to each cable can be determined according to the colors of the cables, and thus the possibility of the installation of the first cables and the second cables on the incorrect electrical connectors of the motherboard can be reduced.

In addition, the first label is merely adhered on one of the first sub electrical connectors of one of the first cables of the same color, and the second label is merely adhered on one of the second sub electrical connectors of one of the blue first cables of the same color, such that one pair of the electrical connectors of the motherboard corresponding to two sub electrical connectors of each cable can be determined, and thus the possibility of the installation of the first cables and the second cables on the incorrect electrical connectors of the motherboard can be further reduced.

Moreover, the first sub electrical connectors of each of the first cables have different marks, and the second sub electrical connectors of each of the second cables have different marks, such that it helps to install the sub electrical connectors of each cable on the correct electrical connectors of the motherboard.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A riser card module, comprising:
   a frame assembly, comprising a mount component, a first frame and a second frame, wherein the first frame and the second frame are fixed to the mount component, the first frame has two first installation slots, and the second frame has two second installation slots;
   two first riser card assemblies, each comprising a first circuit board and a first cable connected to each other, wherein the two first circuit boards are respectively mounted into the two first installation slots; and
   two second riser card assemblies, each comprising a second circuit board and a second cable connected to each other, wherein the two second circuit boards are respectively mounted into the two second installation slots, and colors of the two second cables are different from colors of the two first cables.

2. The riser card module according to claim 1, further comprising a first label and a second label, wherein the colors of the two first cables are the same as each other, the first label is adhered on one of the two first cables, the colors of the two second cables are the same as each other, and the second label is adhered on one of the two second cables.

3. The riser card module according to claim 2, wherein each of the two first cables comprises a first main route, a first main electrical connector, two first branch routes and two first sub electrical connectors, the first main electrical connector is connected to one end of the first main route and is mounted on the first circuit board, the two first branch routes are connected to another end of the first main route, the two first sub electrical connectors are respectively connected to ends of the two first branch routes located farther away from the first main route, the first label is adhered on one of the two first sub electrical connectors of one of the two first cables, each of the two second cables comprises a second main route, a second main electrical connector, two second branch routes and two second sub electrical connectors, the second main electrical connector is connected to one end of the second main route and is mounted on the second circuit board, the two second branch routes are connected to another end of the second main route, the two second sub electrical connectors are respectively connected to ends of the two second branch routes located father away from the second main route, and the second label is adhered on one of the two second sub electrical connectors of one of the two second cables.

4. The riser card module according to claim 3, wherein marks of the two first sub electrical connectors of each of the two first cables are different from each other, and marks of the two second sub electrical connectors of each of the two second cables are different from each other.

5. The riser card module according to claim 2, wherein the first frame has two marks different from each other, the two marks of the first frame are respectively located aside the two first installation slots, and the second frame has two marks different from each other, and the two marks of the second frame are respectively located aside the two second installation slots.

6. An expansion card device, comprising:
   a casing;
   a riser card module, comprising:
      a frame assembly, fixed to the casing and comprising a mount component, a first frame and a second frame, wherein the first frame and the second frame are fixed to the mount component, the first frame has two first installation slots, and the second frame has two second installation slots;
      two first riser card assemblies, each comprising a first circuit board and a first cable connected to each other, wherein the two first circuit boards are respectively mounted into the two first installation slots; and
      two second riser card assemblies, each comprising a second circuit board and a second cable connected to each other, wherein the two second circuit boards are respectively mounted into the two second installation slots, and colors of the two second cables are different from colors of the two first cables; and
   four expansion cards, respectively mounted to the two first circuit boards and the two second circuit boards.

7. The expansion card device according to claim 6, wherein the riser card module further comprises a first label and a second label, the colors of the two first cables are the same as each other, the first label is adhered on one of the two first cables, the colors of the two second cables are the same as each other, and the second label is adhered on one of the two second cables.

8. The expansion card device according to claim 7, wherein each of the two first cables comprises a first main route, a first main electrical connector, two first branch routes and two first sub electrical connectors, the first main electrical connector is connected to one end of the first main route and is mounted on the first circuit board, the two first branch routes are connected to another end of the first main route, the two first sub electrical connectors are respectively connected to ends of the two first branch routes located farther away from the first main route, the first label is adhered on one of the two first sub electrical connectors of one of the two first cables, each of the two second cables comprises a second main route, a second main electrical connector, two second branch routes and two second sub electrical connectors, the second main electrical connector is connected to one end of the second main route and is mounted on the second circuit board, the two second branch routes are connected to another end of the second main route, the two second sub electrical connectors are respectively connected to ends of the two second branch routes located father away from the second main route, and the second label is adhered on one of the two second sub electrical connectors of one of the two second cables.

9. The expansion card device according to claim 8, wherein marks of the two first sub electrical connectors of each of the two first cables are different from each other, and marks of the two second sub electrical connectors of each of the two second cables are different from each other.

10. The expansion card device according to claim 7, wherein the first frame has two marks different from each other, the two marks of the first frame are respectively located aside the two first installation slots, and the second frame has two marks different from each other, and the two marks of the second frame are respectively located aside the two second installation slots.

* * * * *